United States Patent [19]

Hisada

[11] Patent Number: 4,837,634
[45] Date of Patent: Jun. 6, 1989

[54] APPARATUS FOR DECODING IMAGE CODES OBTAINED BY COMPRESSION PROCESS

[75] Inventor: Katsutoshi Hisada, Tokyo, Japan

[73] Assignee: Canon Kabushik Kaisha, Tokyo, Japan

[21] Appl. No.: 739,069

[22] Filed: May 29, 1985

[30] Foreign Application Priority Data

Jun. 5, 1984 [JP] Japan .................... 59-114831
Jun. 5, 1984 [JP] Japan .................... 59-114832

[51] Int. Cl.$^4$ .......................................... H04M 1/419
[52] U.S. Cl. .................... 358/261.1; 358/264; 358/300
[58] Field of Search ............ 358/260, 261, 264, 293, 358/300; 340/147 DD

[56] References Cited

U.S. PATENT DOCUMENTS

| | | | |
|---|---|---|---|
| 3,748,379 | 7/1973 | Epstein et al. | 358/261 |
| 3,941,922 | 3/1976 | Tsuchiya et al. | 358/261 |
| 4,013,827 | 3/1977 | Starck et al. | 358/264 |
| 4,090,222 | 5/1978 | Nakagome et al. | 358/261 |
| 4,146,909 | 3/1979 | Beckenhauer et al. | 358/261 |
| 4,207,599 | 6/1980 | Murayama et al. | 358/261 |
| 4,262,309 | 4/1981 | Yamaguchi et al. | 358/264 |
| 4,297,727 | 10/1981 | Ogawa et al. | 358/261 |
| 4,376,933 | 3/1983 | Saran et al. | 358/261 |
| 4,399,467 | 8/1983 | Subramaniam | 358/261 |
| 4,421,208 | 4/1984 | Iida | 358/261 |
| 4,494,151 | 1/1985 | Liao | 358/261 |
| 4,591,829 | 5/1986 | Takeda | 340/347 DD |

FOREIGN PATENT DOCUMENTS

| | | |
|---|---|---|
| 0050338 | 4/1982 | European Pat. Off. . |
| 2552751 | 3/1977 | Fed. Rep. of Germany . |
| 1547613 | 10/1967 | France . |
| 2215767 | 8/1974 | France . |
| 1338731 | 11/1971 | United Kingdom . |
| 1328061 | 8/1973 | United Kingdom . |
| 1508653 | 4/1978 | United Kingdom . |
| 1580570 | 12/1980 | United Kingdom . |

Primary Examiner—Edward L. Coles, Sr.
Attorney, Agent, or Firm—Fitzpatrick, Cella, Harper & Scinto

[57] ABSTRACT

An apparatus for decoding compressed image codes ensures exact synchronization of decoded image signals by differentiating the decoding process in response to the detection of a particular code.

36 Claims, 11 Drawing Sheets

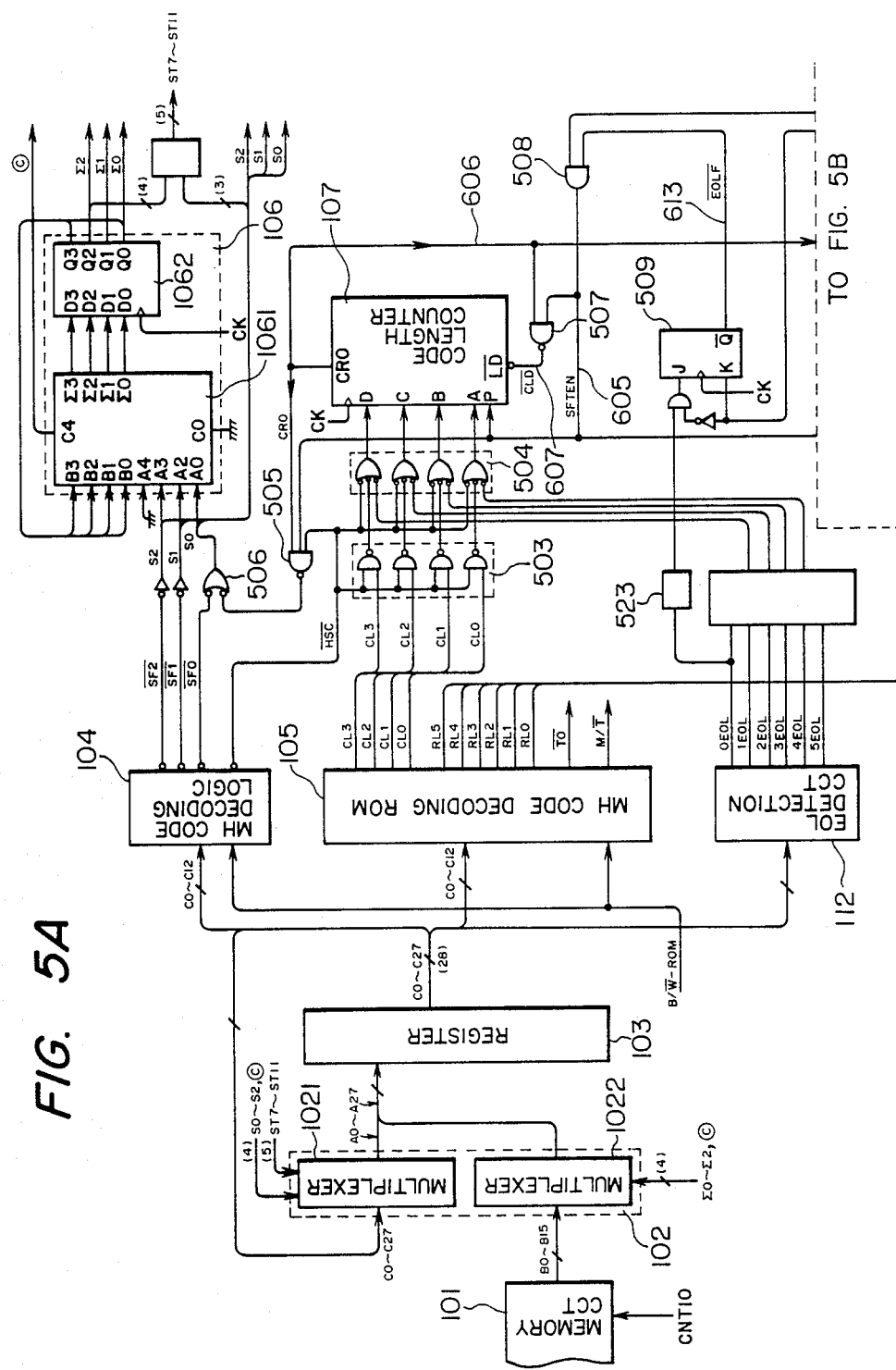

APPARATUS FOR DECODING IMAGE CODES OBTAINED BY COMPRESSION PROCESS

BACKGROUND OF THE INVENTION

1. Field of the Invention

The present invention relates to an apparatus for decoding compressed codes obtained by band compression encoding, employed in facsimile or electronic image file.

2. Description of the Prior Art

In conventional image transmitting system such as facsimile, or image file employing for example optical or magnetic disks, image data are compressed for reducing the quantity of data, in order to achieve efficient high-speed transmission or storage.

Such data compression is achieved by so-called code conversion. In modified Hoffman (MH) encoding process, which is a typical data compression process, each block of consecutive white or black pixels in the image is replaced by another compression code. A frequently appearing pixel block is represented by a compression code of a shorter code length while a less frequently appearing pixel block is represented by a compression code of a longer code length. In this manner the entire image is represented by a train of other codes of a smaller number of bits, based on the deviation in the frequency of combinations of pixels.

In the above-mentioned MH encoding process, an end-of-line signal (EOL code), indicating the end of each line, is added to the compression codes representing the image information. Said EOL code does not represent the image information but is utilized in line control in the printing operation for the decoded image information or for detecting the leading end of the compression codes to be decoded.

In recent years there have been developed high-speed printers capable of image formation of high image quality such as laser beam printers utilizing electrophotographic process, and it is desired to achieve real-time regeneration of a compressed image by means of such printer. For achieving such real-time decoding and image reproduction, it is essential to establish exact synchronization between the recording operation of each line in the printer and the decoding operation for the compression codes.

In the MH encoding process, the correspondence between each block of pixels and each compression code is determined by an empirical rule, and the code length of the compression codes is not constant. Consequently, when plural compression codes are entered in consecutively manner, it is required to exactly separate the compression codes of different code lengths for achieving accurate decoding.

In the conventional facsimile apparatus, a high-speed decoding is not required since the signal transfer rate in the transmission line is not high and a very high image quality is not expected. For this reason, in such facsimile apparatus, the decoding for consecutively entered compression codes is achieved by a software process in an inexpensive microcomputer.

On the other hand, as mentioned above, it is desired to effect real-time reproduction of the compressed image, utilizing a recently developed high-speed printer capable of high-quality image formation such as an electrophotographic laser beam printer. However the processing speed in such printer is in excess of 10 megabits per second, which cannot be handled by a software process in a microcomputer. Consequently the conventional software decoding cannot be applied to such case, without a suitable measure such as the use of a semiconductor page memory.

Also as mentioned before, an end-of-line (EOL) code is added, in the MH encoding process, to the compression codes in order to indicate the end of each line, and the receiving apparatus achieves line synchronization by means of said EOL code. Thus, in case an error occurs in the decoding operation by some reason, the decoding circuit re-starts the decoding operation by detecting an immediately succeeding EOL code. The EOL code plays an important role in the decoding operation, and an erroneous detection of the EOL code induces an error in the succeeding decoding operation, thus hindering exact image reproduction.

Also the length of code or codes constituting a line is not constant since the compression codes have different code lengths as mentioned before. The detection of the EOL code is rendered difficult by this fact, since the interval between two EOL codes is not constant.

Also as mentioned before, the EOL code does not represent any image information. Thus, decoding of the EOL code is unnecessary and is a mere loss of time with a complication in the decoding logic.

Since compression codes represent different numbers of pixels, thus requiring different times for image reproduction. For this reason it is difficult to determine the timing of supply of a succeeding code to the decoding circuit. However, for example in a printer incapable of intermittent operation, the decoded data have to be continuously supplied from the decoding circuit to the printer, and the decoding operation of the compression codes has to be effected in corresponding manner.

The decoding operation may not be effected in proper manner either by an erroneous operation of the decoding circuit itself or by signal attenuation or external noises in the transmission of the compression codes. In such case the number of pixels or run length may become different from the compression code, so that the image recorded by the decoded image signals may be distorted. Also an error in the decoding of a compression code affects the decoding operation for the ensuing codes, so that such error has to be minimized.

SUMMARY OF THE INVENTION

In consideration of the foregoing, an object of the present invention is to provide an image code decoding apparatus capable of satisfactorily cooperating with a high-speed image recording apparatus for high-quality image recording.

Another object of the present invention is to provide an image code decoding apparatus capable of real-time decoding of image codes to supply image signals in continuous manner to the succeeding apparatus.

Still another object of the present invention is to provide an image code decoding apparatus capable of effectively synchronizing the decoding operation of the image codes with the printing operation of the decoded image information.

Still another object of the present invention is to provide an image code decoding apparatus capable of decoding operation by accurate separation of image codes of different code lengths.

Still another object of the present invention is to provide an image code decoding apparatus capable of receiving a succeeding code to be decoded, according to the characteristic of a decoded code.

Still another object of the present invention is to provide an image code decoding apparatus capable of securely detecting the line synchronization code used as reference, particularly such code entered together with image codes of variable code lengths, thus achieving exact synchronization of the decoding operation.

Still another object of the present invention is to provide an image code decoding apparatus capable of avoiding loss in time resulting from the decoding of the line synchronization code in a similar manner as for other image codes, thus achieving high-speed decoding.

Still another object of the present invention is to provide an image code decoding apparatus capable of matching the reception and decoding of the image codes with the image reproducing operation, thus achieving high-speed decoding operation.

Still another object of the present invention is to provide an image data decoding apparatus capable of exact decoding operation even for data transmitted from the middle of a line or from the middle of a code.

Still another object of the present invention is to provide an image code decoding apparatus capable of effectively identifying errors in the decoding of image codes.

Still another object of the present invention is to provide an image code decoding apparatus adapted for real-time decoding operation of image codes.

The foregoing and still other objects of the present invention, and the advantages thereof, will become fully apparent from the following description.

BRIEF DESCRIPTION OF THE DRAWINGS

FIG. 5(A) and 5(B) are a circuit diagram showing the details of the circuit shown in FIG. 1;

DETAILED DESCRIPTION OF THE PREFERRED EMBODIMENTS

Now the present invention will be clarified in detail by the following description of the preferred embodiments.

Figure 1:
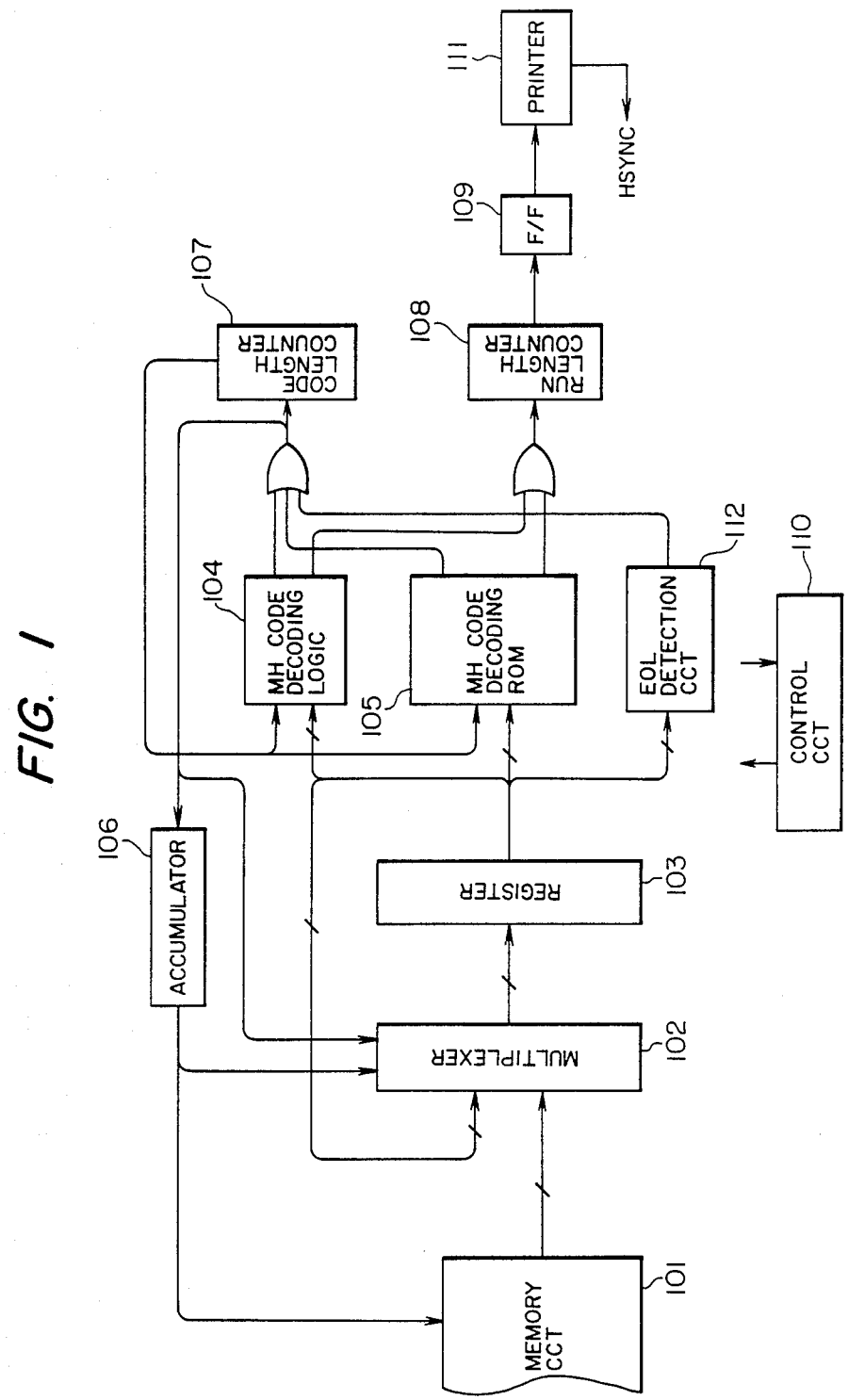
FIG. 1 is a block diagram schematically showing an embodiment of the present invention.
Figure 2A:
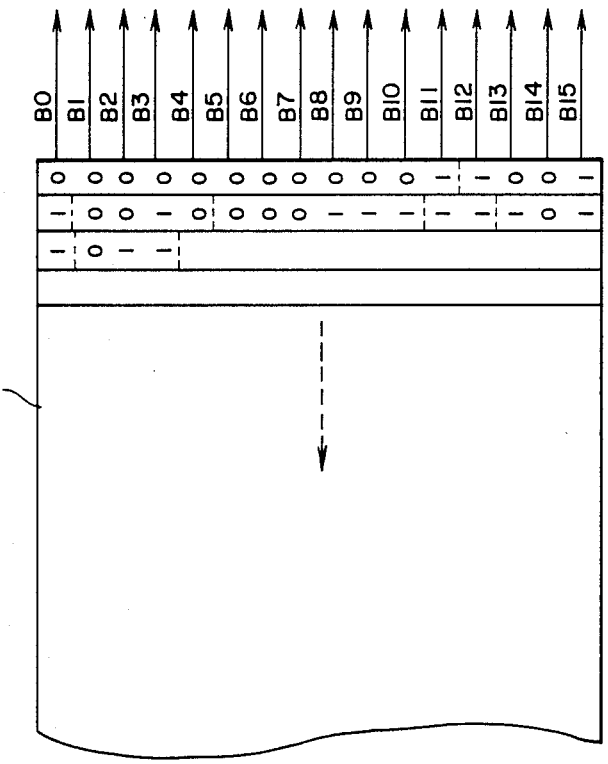
FIG. 2(A) is a chart showing the format of storage of MH codes in a memory circuit 101.
Figure 2B:
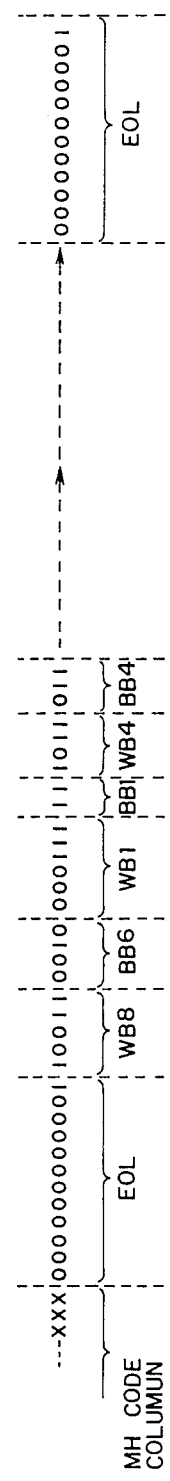
FIG. 2(B) is a chart showing plural consecutive MH codes.

At first referring to FIG. 1 showing an embodiment of the present invention, a memory circuit 101 stores image signals entered for example from a reader for photoelectrically reading an image, or an electronic file in which images are filed, or a receiver unit for receiving image information through a transmission channel such as a telephone line. Said memory circuit 101 is composed for example of a random access memory (RAM) or a latch circuit and is adapted to store so-called modified Hoffman codes, obtained by separate compression of image signals, in a form allowing successive read-outs in a unit of 16 bits or 1 word. FIG. 2(A) shows an example of storage of the MH codes in the memory circuit 101. Though the MH codes have variable code length from 2 bits at minimum to 13 bits at maximum, the serial train of codes as shown in FIG. 2(B) is converted into parallel form of 16 bits regardless of the varying code lengths. In FIG. 2(B), WB and BB respectively represent white and black pixels, and a figure immediately following WB or BB represents the run length of the code. Thus, WB8, for example, is an MH code representing white pixels of a run length of eight. In this format, the end of each word of 16 bits does not necessarily correspond to the partition between the MH codes. The memory circuit 101 is capable of parallel release of the words in successive manner in response to an external control.

In FIG. 1 there is provided a multiplexer or data selector 102. A register 103 with parallel input and output of 28 bits performs a function of temporarily storing an MH code supplied from the memory circuit 101 through the multiplexer 102, and a function of supplying an MH code already stored in said register 103 to an MH code decoding logic 104, an MH code decoding ROM (read-only memory) 105 etc. to be explained later.

Figure 3:
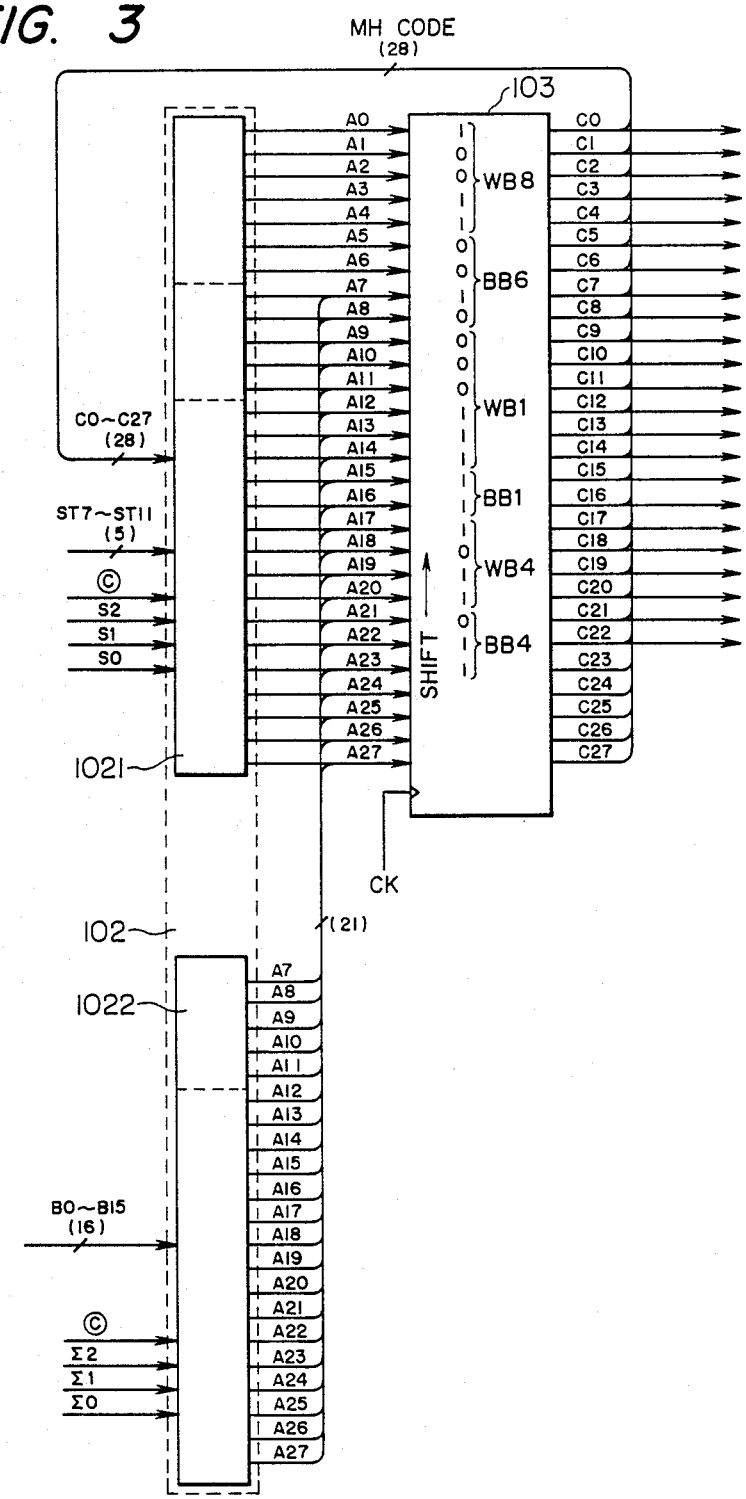
FIG. 3 is a block diagram showing a bit shifter.

The multiplexer 102 and the register 103 constitute so-called bit shifter capable of serial shifting of data and a jump shifting of n bits. Said bit shifter performs a function, under the control of output signals of the MH code decoding logic 104 and the MH code decoding ROM 105 etc. to be explained later, of shifting the MH codes by a desired number of bits from the memory circuit 101 and storing the same in the register 103 regardless of the partition between the MH codes in the aforementioned manner. FIG. 3 shows the detailed structure of the bit shifter, illustrating a state in which an MH code WB8 (10011), representing white pixels of a run length of eight, has reached a decoding position by applying a suitable control to the MH codes shown in the memory circuit 101 of FIG. 2. A state in which the leading bit of an MH code is positioned at an output C0 or the least significant bit of the register 103 shown in FIG. 3 is called a decodable position, and such state will hereinafter be called a "head positioning completed" state. In the codes illustrated in the register 103 in FIG. 3, the MH code WB8, representing white pixels of a run length of eight, is in such "head positioning completed" state.

In FIG. 1, the MH code decoding logic 104 (hereinafter simply called logic 104) decodes four MH codes in which the run length represented by the code is shorter than the code length thereof, i.e. the MH codes for a white run length of one (MH code "000111" with a code length 6 > run length 1), a white run length of two (MH code "0111" with a code length 4 > run length 2), a white run length of three (MH code "1000" with a code length 4 > run length 3) and a black run length of one (MH code "010" with a code length 3 > run length 1).

In the following description, the above-mentioned four MH codes representing white run lengths of one, two and three, and a black run length of one will be collectively called HSC codes.

In FIG. 1 the MH code decoding ROM 105 is used for decoding all the MH codes, including four aforementioned MH codes to be decoded by the above-mentioned logic 104.

The MH codes are shared between the logic 104 and the ROM 105 according to the processing speed and method for MH codes. These two decoders release the run length, code length, classification of image color which is black or white, and the presence or absence of make-up code or terminate code for each MH code whenever said code reaches the "head positioning completed" state in the register 103.

An EOL detecting circuit 112 detects, in the MH codes serially stored in the register 103, the presence and position of the EOL code used for line synchronization.

In FIG. 1, a run length counter 108 is composed of a binary counter capable of counting from a count "0" to a number in excess of the maximum run length "2560" of the make-up code, and releases a count end signal (a ripple carry signal CR in the present embodiment) when the run length of the MH codes released from the logic 104 or the ROM 105 is counted.

A flip-flop 109 inverts the output signal thereof each time the count end signal (ripple carry signal CR) is received from said run length counter 108, but is so controlled that the inversion of the output signal does not take place in response to a count end signal of a make-up code as will be explained later. The output signals of said flip-flop 109 constitute the image signals obtained by decoding the MH codes read from the memory circuit.

A code length counter 107 is composed of a binary counter capable of counting from a count "0" to a number in excess of the maximum code length "13" of the MH code. In case of discharging an MH code, which is in the head positioning completed state in the register 103, from said register 103 by serial or jump shifting after decoding and shifting a succeeding MH code to such head positioning completed state, the amount of said shifting is counted and controlled by said counter 107.

A 4-bit accumulator 106 counts empty bits formed in the register 103 by discharging the decoded MH code, and fills the empty bits in the register 103 a new MH code of 1 word or 16 bits in parallel manner from the memory circuit 101 when the number of said empty bits reaches 16 bits. In this manner a train of MH codes are supplied from the register 103 to the logic 104 or ROM 105 without interruption, thus enabling high-speed decoding operation.

A control circuit 110 controls the input and output signals of blocks 101–109 shown in FIG. 1.

In this manner there is achieved the decoding of the MH codes, namely the conversion of the MH codes into the image signals. The decoded image signals are supplied to a printer 111 for image recording for each line on a recording material. The printer 111 releases a horizontal synchronization signal HSYNC in each scanning operation, and said signal is utilized for determining the timing of the decoding operation.

Now there will be given a further detailed explanation on an embodiment of the present invention, providing so-called "high-speed real-time MH decoder" which is used for supplying the image signals, obtained by decoding the compressed MH codes, to a high-speed printer such as a laser beam printer, without any intermediate image memory. It is therefore necessary to achieve a high processing speed in the MH decoder and a satisfactory synchronization between the high-speed printer and the output image signals of the MH decoder, with an assumed frequency between 10 and 20 MHz. A desired "high-speed real-time MH decoder" can be realized by a processing method to be explained in the following, in which:

(1) the synchronization between the MH decoder and the printer is achieved by the EOL code and the horizontal synchronization signal HSYNC generated by the printer for each line, and (2) for discharging a decoded MH code from the register 103 shown in FIG. 1 and shifting a succeeding MH code to the head positioning completed state, either serial shifting or jump shifting is selected according to the code to be discharged.

In the following there will be explained a detailed structure for achieving the above-mentioned two points.

Figure 8:
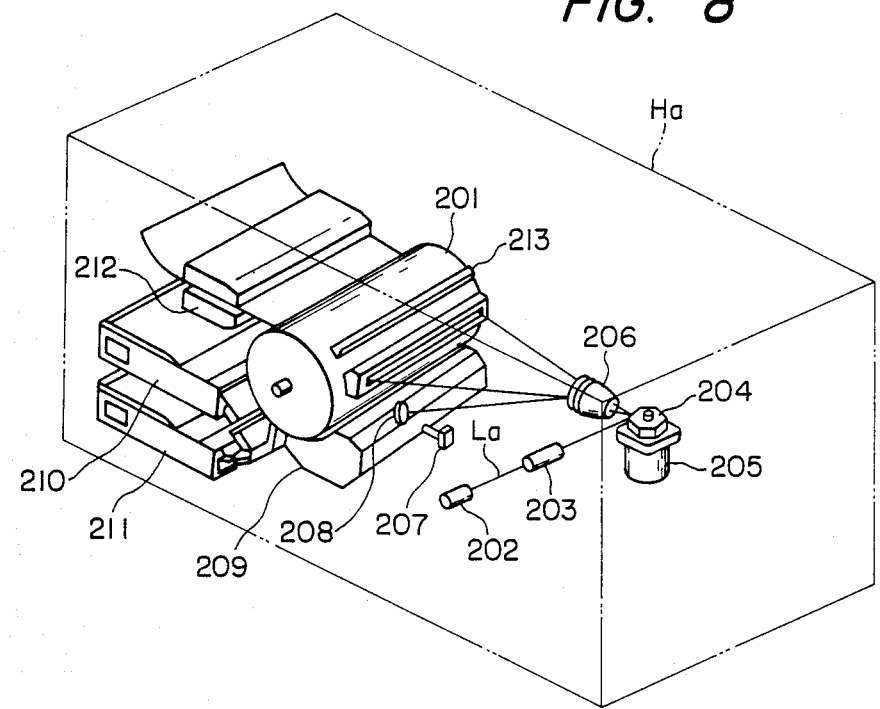
FIG. 8 is a perspective view showing an example of the structure of a printer.

FIG. 8 is a perspective view of a laser beam printer used as an example of the output unit.

Said printer is based on an electrophotographic process utilizing a laser beam, wherein a photosensitive drum 201 is rotatably supported in a housing Ha. A semiconductor laser 202 emits a laser beam La, which is expanded to a determined diameter by a beam expander 203 and is introduced into a polygonal mirror 204 having plural mirror faces and rotated at a determined speed by a motor 205, whereby the laser beam emerging from the beam expander 203 is given a scanning motion in a substantially horizontal direction, and is focused, by means of an imaging lens 206 of $f-\theta$ characteristic, as a light spot on the photosensitive drum 201 charged in advance to a determined polarity by a charger 213.

A beam detector 207 detects the laser beam reflected by a mirror 208, and a resulting detection signal is used for determining the timing of modulating operation of the semiconductor laser 202 in order to provide the photosensitive drum 201 with optical information in desired manner.

The scanning laser beam forms, on the photosensitive drum 201, an electrostatic latent image of a high resolving power, which is rendered visible in a developing unit 209 and is then transferred onto a recording material supplied from a cassette 210 or 211. Said recording material passes through a fixing unit 212 to fix thus transferred image on said material, and a hard copy thus obtained is discharged to an unrepresented discharge unit.

Figure 9:
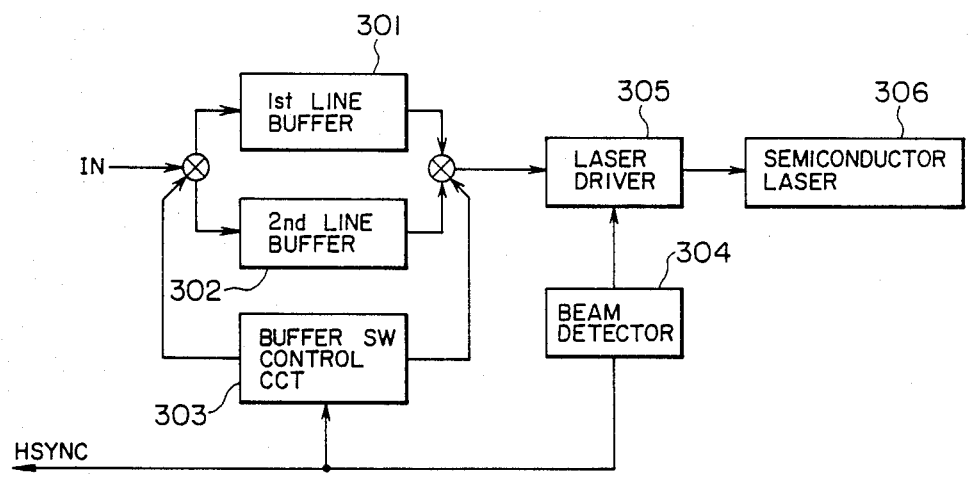
FIG. 9 is a block diagram of a circuit for recording operation of the printer shown in FIG. 8.

FIG. 9 shows an example of a printer circuit for modulating the laser beam of the semiconductor laser shown in FIG. 8 according to the image signals.

Image signals VIDEO obtained by decoding and entered from an input terminal IN are alternately supplied, for each signal group corresponding to a scanning line, to a first line buffer 301 and a second line buffer 302 each composed for example of a shift register of a number of bits at least equal to the number of pixels in a scanning line, under the control of a buffer switch control circuit 303.

The image signals supplied to the first and second line buffers 301, 302 are alternately read and supplied to a laser driver 305, in response to a trigger signal composed of the beam detection signal from the beam detector 304.

The laser driver 305 controls the modulating operation of the semiconductor laser 306 for controlling the emission thereof, in response to the entered image signals.

The use of two line buffers permits satisfactory response to the high-speed input signals, since the image signals can be stored in a line buffer while already stored image signals can be supplied from the other line buffer to the laser driver 305.

The beam detection signal from the beam detector 304 is supplied also to the decoding circuit as the horizontal synchronization signal HSYNC, and is utilized for synchronizing the decoding operation with the recording operation in the printer.

In the printer of the present embodiment, the decoded image signals are entered through two line buffers, consisting of the first line buffer 301 and the second line buffer 302, and such double buffer structure enables a correcting function in case of an error in the decoding operation. More specifically, in case an error occurs in the decoding operation in the course of storage of decoded image signals into a line buffer, the printing operation with the image signals stored in said line buffer including said error is prohibited, and the printing operation is executed with the image signals of a preceding line already stored in the other line buffer.

In this manner the undesirable effect to the reproduced image can be avoided since the image signals containing errors in decoding are not used in the printing operation. Though such correcting function generates at least two lines of image corresponding same image signals, but such doubled images do not affect the reproduced image in significant manner in the recording operation of a high resolving power, for example 16 pixels/mm, employed in the present embodiment.

Figure 4:
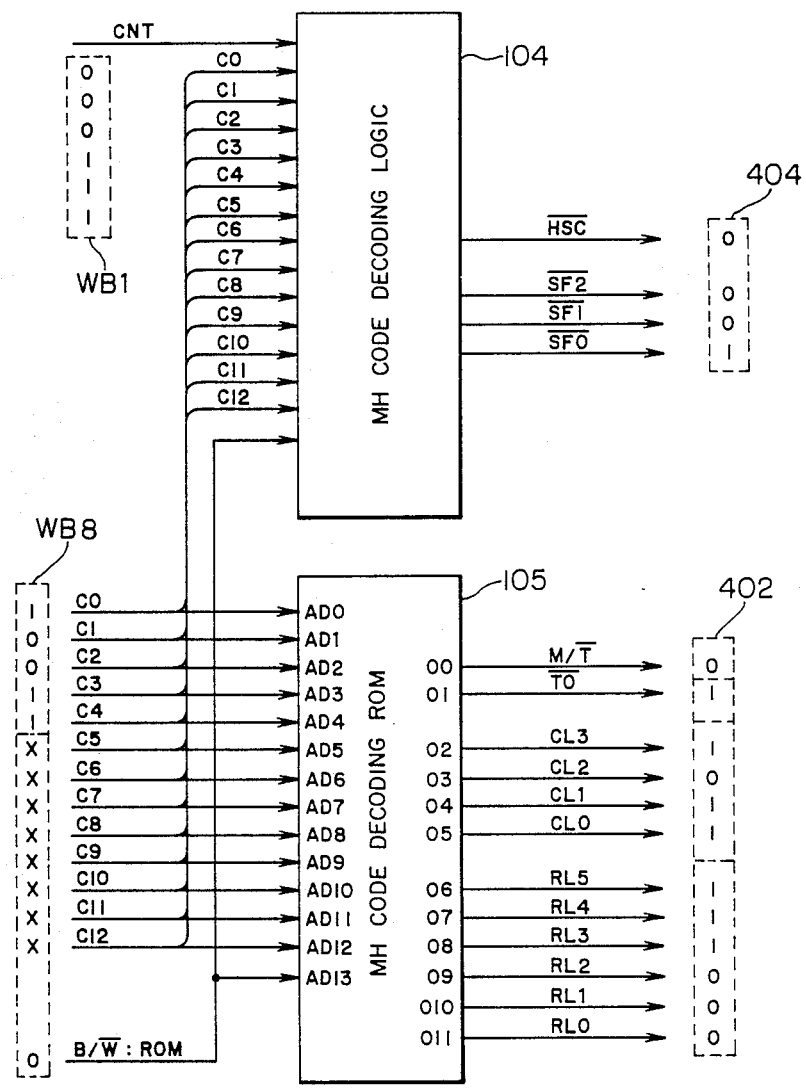
FIG. 4 is a block diagram showing a decoding circuit for MH codes.

In FIG. 4, 105 corresponds to the MH code decoding ROM shown in FIG. 1 and is in fact composed of plural ROM's. The ROM 105 is provided with address ports AD0—AD13 and output ports O0–O11, and has a memory format as will be explained in the following.

The least significant bit (LSB) of an MH code to be decoded, supplied from the register 103, is positioned at an address port AD0 of the ROM 105, and the following bits of said MH code are respectively given, in successive manner, to address ports AD1–AD11 of the ROM 105. An address port AD13 receives a signal B/W-ROM, indicating the color of the MH code, wherein "1" and "0" respectively stand for black and white. In case the MH code is shorter than 12 bits, the deficient bits are neglected (DON'T CARE). The EOL code is handled as a make-up code. Also the color bit (AD13) of a make-up code having a run length equal to or larger than 1972 is neglected (DON'T CARE).

The ROM 105 stores the contents of the MH codes corresponding to the addresses defined in the above-mentioned manner, and releases output signals corresponding to the MH codes through output ports O0–O11. More specifically, an output port O0 releases a signal M/T which is "1" or "0" respectively when the decoded MH code is a make-up code or a terminate code. An output port O1 releases a signal TO which is "0" when the decoded MH code is a white code with a run length 0 (00110101) or a black code with a run length 0 (0000110111), or "1" in other cases.

Output ports O2–O5 release 4-bit output signals CL0–CL3 representing the code length of each MH code as a compliment to 2, wherein the output port O5 releases the least significant bit of said code length.

Output ports O6–O11 release 6-bit output signals RL0–RL5 representing the run length of each MH code as a compliment to 2, wherein the output port O11 releases the least significant bit of said run length. For a make-up code, the upper six bits alone in binary expression of the run length are allotted to the output ports O6–O11, since the run length of a make-up code in the MH encoding can be represented by the upper 6 bits alone. A frame 402 in FIG. 4 shows, as an example, the outputs O0–O11 of the ROM 105 obtained by decoding an MH code WB8 (10011) representing white bits of a run length eight. The MH codes employed in the present embodiment are obtained according the CCITT YELLOW BOOK, Fascicle VII. 2 Rec. T.4 TABLE 1/T.4 and TABLE 2/T.4.

In FIG. 4 an MH code decoding logic 104 corresponds to that shown in FIG. 1 and is composed, in the present embodiment, of AND gates and OR gates. An output signal HSC of the logic 104 assumes a state "0" upon detection of an HSC code, i.e. a white MH code with a run length 1, 2 or 3, or a black MH code with a run length 1. Output signals SF0–SF2 represent the code lengths of the above-mentioned four HSC codes in inverted binary expression. A frame 404 in FIG. 4 shows, as an example, the output signals obtained by decoding a white MH code WB1 (000111) representing a white image with a run length of one.

In the present embodiment a logic circuit is employed for decoding the HSC codes, since the current ROM addressing method is unable to cope with the requirement of high-speed decoding.

Now reference is made to Tabs. 1 and 2 for explaining the function of the bit shifter shown in FIG. 3.

A multiplexer 102 shown in FIG. 3 corresponds to that shown in FIG. 1 and is composed of two tristate multiplexers 1021, 1022. When a control line (C) from the accumulator 106 to the multiplexer 102 assumes a state "0", outputs A7–A27 from the multiplexer 1022 to the register 103 are in a floating state and are therefore rendered ineffective, and outputs A0–A27 from the multiplexer 1021 are effectively supplied to the register 103 to derive output signals C0–C27 therefrom. In this state the multiplexer 1021 selects the signals S0–S27 entered from the register 103, under the control by input lines S0–S2, in a manner shown in Tab. 1. For example, in case S0=S1=1 and S2=0, the output signals C3–C27 of the register 103 are received and are respectively supplied as the output signals A1–A23.

Then, when the control line (C) to the multiplexer 102 assumes a state "1", the output signals A0–A6 of the multiplexer 102 are given by the multiplexer 1021 selectively in response to the state of the input lines S0–S2, in a similar manner as in the case where the control line (C) is in a state "0". The outputs A7–A27 from the multiplexer 102, except those marked as Y in Tab. 2, are given by the multiplexer 1022, while the outputs A7–A27 of the multiplexer 1021, except those marked as Y in Tab. 2 are in the floating state and are therefore rendered ineffective. The outputs A7–A27 supplied from the multiplexer 1022 to the register 103 are selected, as shown in Tab. 2, by input lines Σ0–Σ2, but the bits marked with Y in Tab. 2 are selected from the multiplexer 1021. The number of said bits Y is determined by controlling the state of the multiplexer 1021 by input lines ST7–ST11 giving signals in cooperation with the input lines Σ0–Σ2 to the multiplexer 1022. The circuits of the multiplexers 1021, 1022 shown in FIG. 3 can be easily realized with the commercially available multiplexer, for example F215 supplied by Fairchild, and associated circuits The outputs A0–A27 selected as output signals to the register 103 are latched in the register 103 in response to a clock signal CK.

The above-described bit shifter allows to shift, by an arbitrary number of bits, the MH code supplied in 16-bit parallel form, from the memory circuit 101, thus bringing the MH code of a variable code length to the aforementioned "head positioning completed" state.

TABLE 1

| C | 0 | 0 | 0 | 0 | 0 | 0 | 0 | 0 |
|---|---|---|---|---|---|---|---|---|
| $S_2$ | 0 | 0 | 0 | 0 | 1 | 1 | 1 | 1 |
| $S_1$ | 0 | 0 | 1 | 1 | 0 | 0 | 1 | 1 |
| $S_0$ | 0 | 1 | 0 | 1 | 0 | 1 | 0 | 1 |
| $A_0$ | $C_0$ | $C_1$ | $C_2$ | $C_3$ | $C_4$ | $C_5$ | $C_6$ | $C_7$ |
| $A_1$ | $C_1$ | $C_2$ | $C_3$ | $C_4$ | $C_5$ | $C_6$ | $C_7$ | $C_8$ |
| $A_2$ | $C_2$ | $C_3$ | $C_4$ | $C_5$ | $C_6$ | $C_7$ | $C_8$ | $C_9$ |
| $A_3$ | $C_3$ | $C_4$ | $C_5$ | $C_6$ | $C_7$ | $C_8$ | $C_9$ | $C_{10}$ |
| $A_4$ | $C_4$ | $C_5$ | $C_6$ | $C_7$ | $C_8$ | $C_9$ | $C_{10}$ | $C_{11}$ |
| $A_5$ | $C_5$ | $C_6$ | $C_7$ | $C_8$ | $C_9$ | $C_{10}$ | $C_{11}$ | $C_{12}$ |
| $A_6$ | $C_6$ | $C_7$ | $C_8$ | $C_9$ | $C_{10}$ | $C_{11}$ | $C_{12}$ | $C_{13}$ |
| $A_7$ | $C_7$ | $C_8$ | $C_9$ | $C_{10}$ | $C_{11}$ | $C_{12}$ | $C_{13}$ | $C_{14}$ |
| $A_8$ | $C_8$ | $C_9$ | $C_{10}$ | $C_{11}$ | $C_{12}$ | $C_{13}$ | $C_{14}$ | $C_{15}$ |
| $A_9$ | $C_9$ | $C_{10}$ | $C_{11}$ | $C_{12}$ | $C_{13}$ | $C_{14}$ | $C_{15}$ | $C_{16}$ |
| $A_{10}$ | $C_{10}$ | $C_{11}$ | $C_{12}$ | $C_{13}$ | $C_{14}$ | $C_{15}$ | $C_{16}$ | $C_{17}$ |
| $A_{11}$ | $C_{11}$ | $C_{12}$ | $C_{13}$ | $C_{14}$ | $C_{15}$ | $C_{16}$ | $C_{17}$ | $C_{18}$ |
| $A_{12}$ | $C_{12}$ | $C_{13}$ | $C_{14}$ | $C_{15}$ | $C_{16}$ | $C_{17}$ | $C_{18}$ | $C_{19}$ |
| $A_{13}$ | $C_{13}$ | $C_{14}$ | $C_{15}$ | $C_{16}$ | $C_{17}$ | $C_{18}$ | $C_{19}$ | $C_{20}$ |
| $A_{14}$ | $C_{14}$ | $C_{15}$ | $C_{16}$ | $C_{17}$ | $C_{18}$ | $C_{19}$ | $C_{20}$ | $C_{21}$ |
| $A_{15}$ | $C_{15}$ | $C_{16}$ | $C_{17}$ | $C_{18}$ | $C_{19}$ | $C_{20}$ | $C_{21}$ | $C_{22}$ |
| $A_{16}$ | $C_{16}$ | $C_{17}$ | $C_{18}$ | $C_{19}$ | $C_{20}$ | $C_{21}$ | $C_{22}$ | $C_{23}$ |
| $A_{17}$ | $C_{17}$ | $C_{18}$ | $C_{19}$ | $C_{20}$ | $C_{21}$ | $C_{22}$ | $C_{23}$ | $C_{24}$ |
| $A_{18}$ | $C_{18}$ | $C_{19}$ | $C_{20}$ | $C_{21}$ | $C_{22}$ | $C_{23}$ | $C_{24}$ | $C_{25}$ |
| $A_{19}$ | $C_{19}$ | $C_{20}$ | $C_{21}$ | $C_{22}$ | $C_{23}$ | $C_{24}$ | $C_{25}$ | $C_{26}$ |
| $A_{20}$ | $C_{20}$ | $C_{21}$ | $C_{22}$ | $C_{23}$ | $C_{24}$ | $C_{25}$ | $C_{26}$ | $C_{27}$ |
| $A_{21}$ | $C_{21}$ | $C_{22}$ | $C_{23}$ | $C_{24}$ | $C_{25}$ | $C_{26}$ | $C_{27}$ | X |
| $A_{22}$ | $C_{22}$ | $C_{23}$ | $C_{24}$ | $C_{25}$ | $C_{26}$ | $C_{27}$ | X | X |
| $A_{23}$ | $C_{23}$ | $C_{24}$ | $C_{25}$ | $C_{26}$ | $C_{27}$ | X | X | X |
| $A_{24}$ | $C_{24}$ | $C_{25}$ | $C_{26}$ | $C_{27}$ | X | X | X | X |
| $A_{25}$ | $C_{25}$ | $C_{26}$ | $C_{27}$ | X | X | X | X | X |
| $A_{26}$ | $C_{26}$ | $C_{27}$ | X | X | X | X | X | X |
| $A_{27}$ | $C_{27}$ | X | X | X | X | X | X | X |

X: DON'T CARE

TABLE 2

| C | 1 | 1 | 1 | 1 | 1 | 1 |
|---|---|---|---|---|---|---|
| $\Sigma_2$ | 0 | 0 | 0 | 0 | 1 | 1 |
| $\Sigma_1$ | 0 | 0 | 1 | 1 | 0 | 0 |
| $\Sigma_0$ | 0 | 1 | 0 | 1 | 0 | 1 |
| $A_0$ | | | | | | |
| $A_1$ | | | | | | |
| $A_2$ | | | | | | |
| $A_3$ | | | | | | |
| $A_4$ | | | | | | |
| $A_5$ | | | | | | |
| $A_6$ | | | | | | |
| $A_7$ | Y | Y | Y | Y | Y | $B_0$ |
| $A_8$ | Y | Y | Y | Y | $B_0$ | $B_1$ |
| $A_9$ | Y | Y | Y | $B_0$ | $B_1$ | $B_2$ |
| $A_{10}$ | Y | Y | $B_0$ | $B_1$ | $B_2$ | $B_3$ |
| $A_{11}$ | Y | $B_0$ | $B_1$ | $B_2$ | $B_3$ | $B_4$ |
| $A_{12}$ | $B_0$ | $B_1$ | $B_2$ | $B_3$ | $B_4$ | $B_5$ |
| $A_{13}$ | $B_1$ | $B_2$ | $B_3$ | $B_4$ | $B_5$ | $B_6$ |
| $A_{14}$ | $B_2$ | $B_3$ | $B_4$ | $B_5$ | $B_6$ | $B_7$ |
| $A_{15}$ | $B_3$ | $B_4$ | $B_5$ | $B_6$ | $B_7$ | $B_8$ |
| $A_{16}$ | $B_4$ | $B_5$ | $B_6$ | $B_7$ | $B_8$ | $B_9$ |
| $A_{17}$ | $B_5$ | $B_6$ | $B_7$ | $B_8$ | $B_9$ | $B_{10}$ |
| $A_{18}$ | $B_6$ | $B_7$ | $B_8$ | $B_9$ | $B_{10}$ | $B_{11}$ |
| $A_{19}$ | $B_7$ | $B_8$ | $B_9$ | $B_{10}$ | $B_{11}$ | $B_{12}$ |
| $A_{20}$ | $B_8$ | $B_9$ | $B_{10}$ | $B_{11}$ | $B_{12}$ | $B_{13}$ |
| $A_{21}$ | $B_9$ | $B_{10}$ | $B_{11}$ | $B_{12}$ | $B_{13}$ | $B_{14}$ |
| $A_{22}$ | $B_{10}$ | $B_{11}$ | $B_{12}$ | $B_{13}$ | $B_{14}$ | $B_{15}$ |
| $A_{23}$ | $B_{11}$ | $B_{12}$ | $B_{13}$ | $B_{14}$ | $B_{15}$ | X |
| $A_{24}$ | $B_{12}$ | $B_{13}$ | $B_{14}$ | $B_{15}$ | X | X |
| $A_{25}$ | $B_{13}$ | $B_{14}$ | $B_{15}$ | X | X | X |
| $A_{26}$ | $B_{14}$ | $B_{15}$ | X | X | X | X |
| $A_{27}$ | $B_{15}$ | X | X | X | X | X |

X: DON'T CARE

As explained above, the identification of MH codes is achieved by inspecting a train of codes moving in the register 103, and said movement is made either by a serial shift, with a bit shift at a time, or by a jump shift of six bits at maximum upon detection of an HSC code, by means of the bit shifter 102. Stated differently the train of codes in the register 103 is so controlled as to move only 6 bits or less in a clock time.

Consequently, when the EOL code (000000000001) moves in the register 103, the least significant bit always appears at one of the ports C0–C5 of said register 103 even if the amount of movement is erroneous due to a preceding operation.

In the decoding of the MH codes, the decoding of the EOL code is very important in consideration of the entire code structure. In the following there will be explained in detail the EOL detecting circuit 112 shown in FIG. 1.

The EOL code not only indicates the end of a line of the image but also has a role of defining the partitions in the ensuing MH codes. Therefore, an error in the detection of EOL code in the decoding operation immediately leads to a confusion in the partitions of the ensuing MH codes. Consequently it becomes impossible to decode the image of said line, and also to detect the EOL codes in the succeeding lines, depending on the detecting method. Thus an error gives rise to a distortion in the printed image, eventually to an extent that said image is almost useless.

It is therefore essential to adopt an EOL detecting method which minimizes the error in the detection of the EOL codes, even when the MH codes contain some errors, due to errors for example in the transmission or reception. The error in decoding can be restored after a line, as long as the EOL codes are securely detected.

Figure 10:
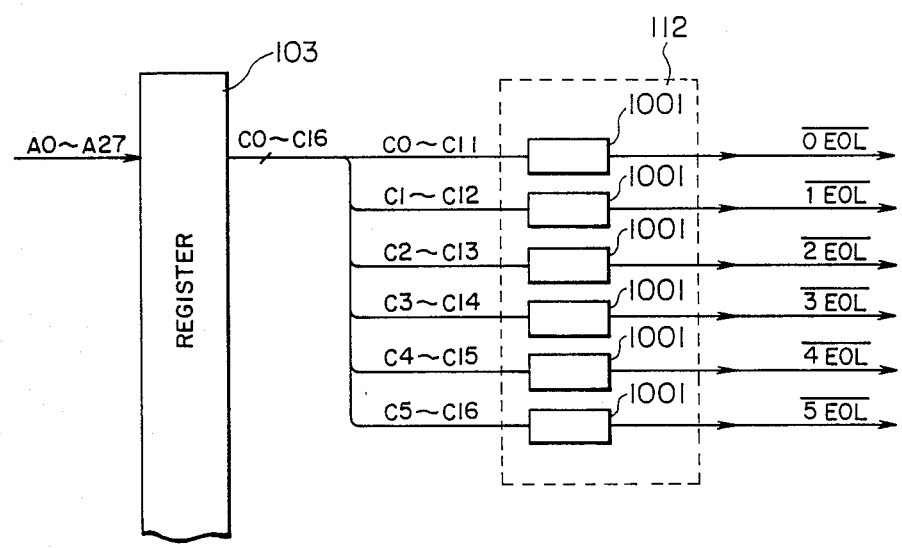
FIG. 10 is a block diagram showing an EOL detecting circuit.

FIG. 10 shows the details of the EOL detecting circuit 112, in which six detecting gates 1001 are provided in parallel manner, corresponding to the maximum 6-bit shift at a time in the register, in order to detect the least significant bit of the 12-bit EOL code (000000000001) at one of the ports C0–C5 of the register 103. Upon detection of the EOL code, the detecting gate 1001 releases a detection signal $\overline{0EOL}$–$\overline{0EOL}$ indicating the position of the EOL code in the register 103.

In this manner the EOL code can be always detected unless the EOL code contains an error bit.

Consequently the errors in the image codes can always be restored within a line. The probability of presence of an error bit in the EOL code is far lower than that in the image code in consideration of the ratio of number of bits and is practically negligible.

Figure 11:
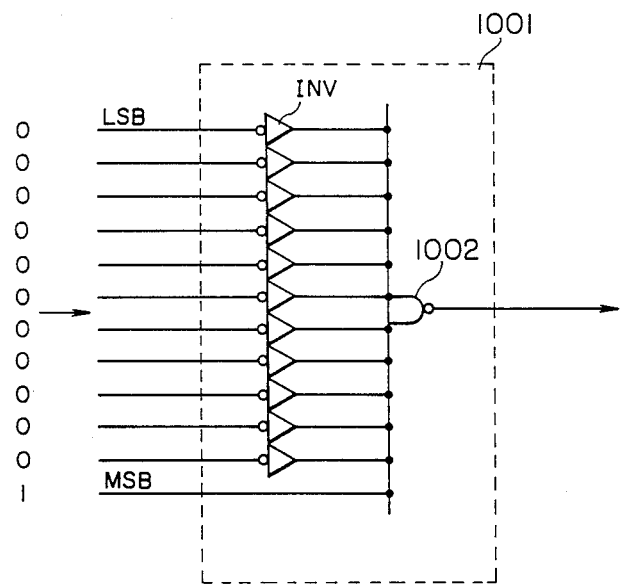
FIG. 11 is a circuit diagram showing the structure of a detecting gate shown in FIG. 10.

FIG. 11 shows the details of the detecting gate for detecting the EOL code, wherein 12-bit data are received in parallel manner. The data of 11 bits, other than the most significant bit, are supplied through inverting gates INV and given, together with said most significant bit, to a NAND gate 1002 of 12 inputs, which decodes the EOL code and releases a low-level output signal in response to the detection of an EOL code.

The output signals $\overline{0EOL}$–$\overline{5EOL}$ of the EOL detecting circuit 112 shown in FIG. 10 are supplied to the code length counter 107 and the accumulator 106. In response to said signals, the accumulator 106 causes the register 103 to effect a shift equal to the code length of the EOL code.

More specifically, the EOL detecting circuit 112 shown in FIG. 10 may detect an EOL code when the register 103 still contains an MH code or fill bits in front of said EOL code. Consequently, in case the EOL detecting circuit 112 releases one of the signals $\overline{1EOL}$--$\overline{5EOL}$, i.e. other than the signal $\overline{0EOL}$, in response to an EOL code, the accumulator 106 causes the register 103 to effect a shift of 12 bits which is equal to the code length of the EOL code, only after the bits remaining in front of the EOL code are discharged from the register 103 by the aforementioned shifting operation.

In this manner the EOL code is completely discharged, and a leading image MH code in the succeeding line to be decoded reaches the "head positioning completed" state. Also it is rendered possible to avoid the loss in time resulting from decoding the EOL code, which does not contain the image information, in the same manner as other MH codes.

Now there will be given a detailed explanation on the entire block diagram shown in FIG. 1 while making reference principally to FIG. 5. Since the function of the circuit shown in FIG. 5 is rather complicated, there will be assumed certain conditions for the purpose of clarity and explained the basic function of said circuit in case of decoding typical MH codes, and subsequently there will be explained the basis of said assumed conditions.

A train of MH codes shown in FIG. 2(b) will be taken as an example of the MH codes to be decoded. In the working principle of said circuit, an EOL code preceding the MH codes shown in FIG. 2(b) is discharged from the register 103 by the aforementioned shifting operation prior to the reception of the horizontal synchronization signal HSYNC from the printer. Thus it is assumed that a white MH code WB8 of a run length of eight, which immediately follows said EOL code and is the first image MH code in the line to be decoded, is in the "head positioning completed" state in the register 103, awaiting said synchronization signal HSYNC from the printer.

Figure 5B:
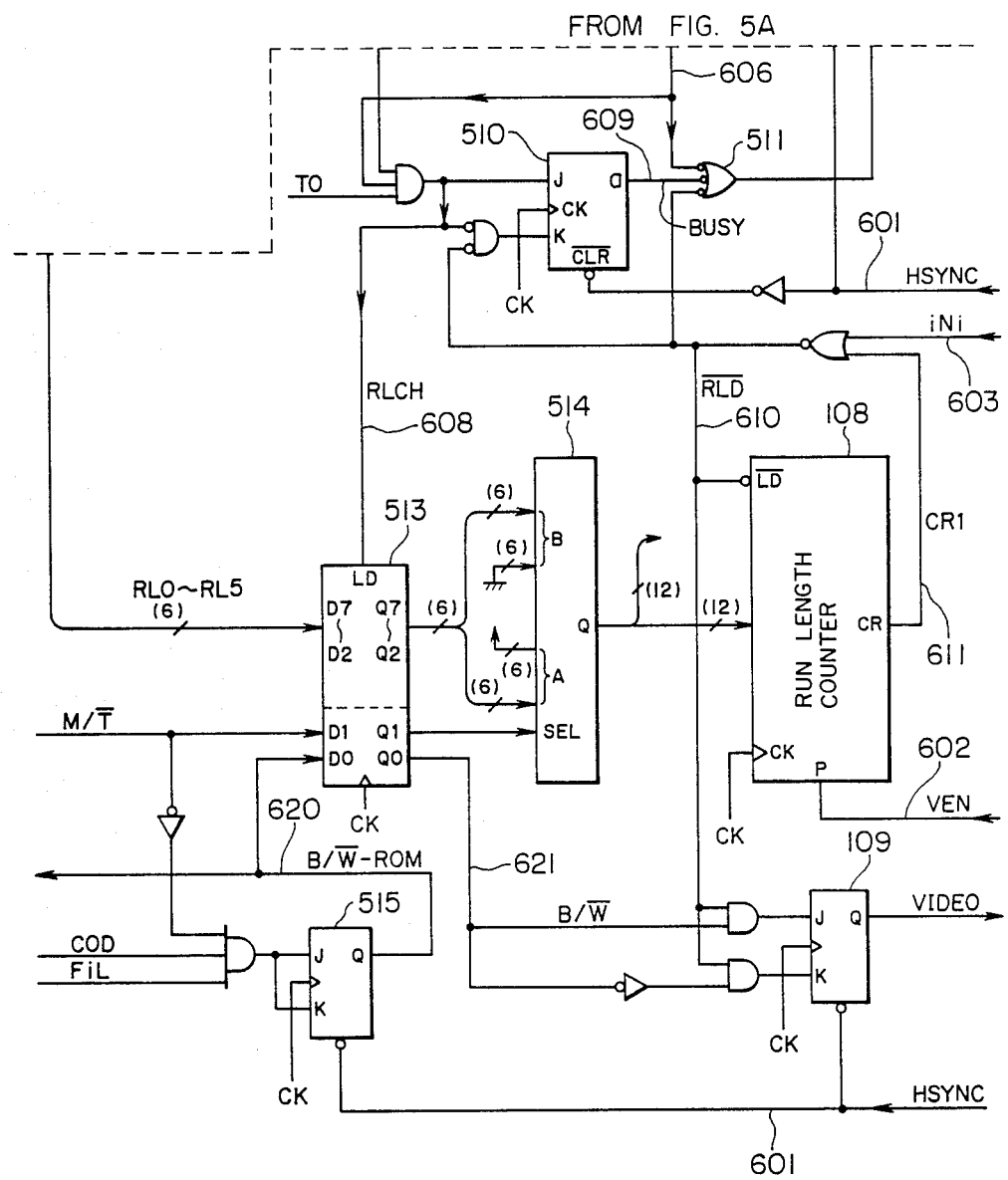
Figure 6:
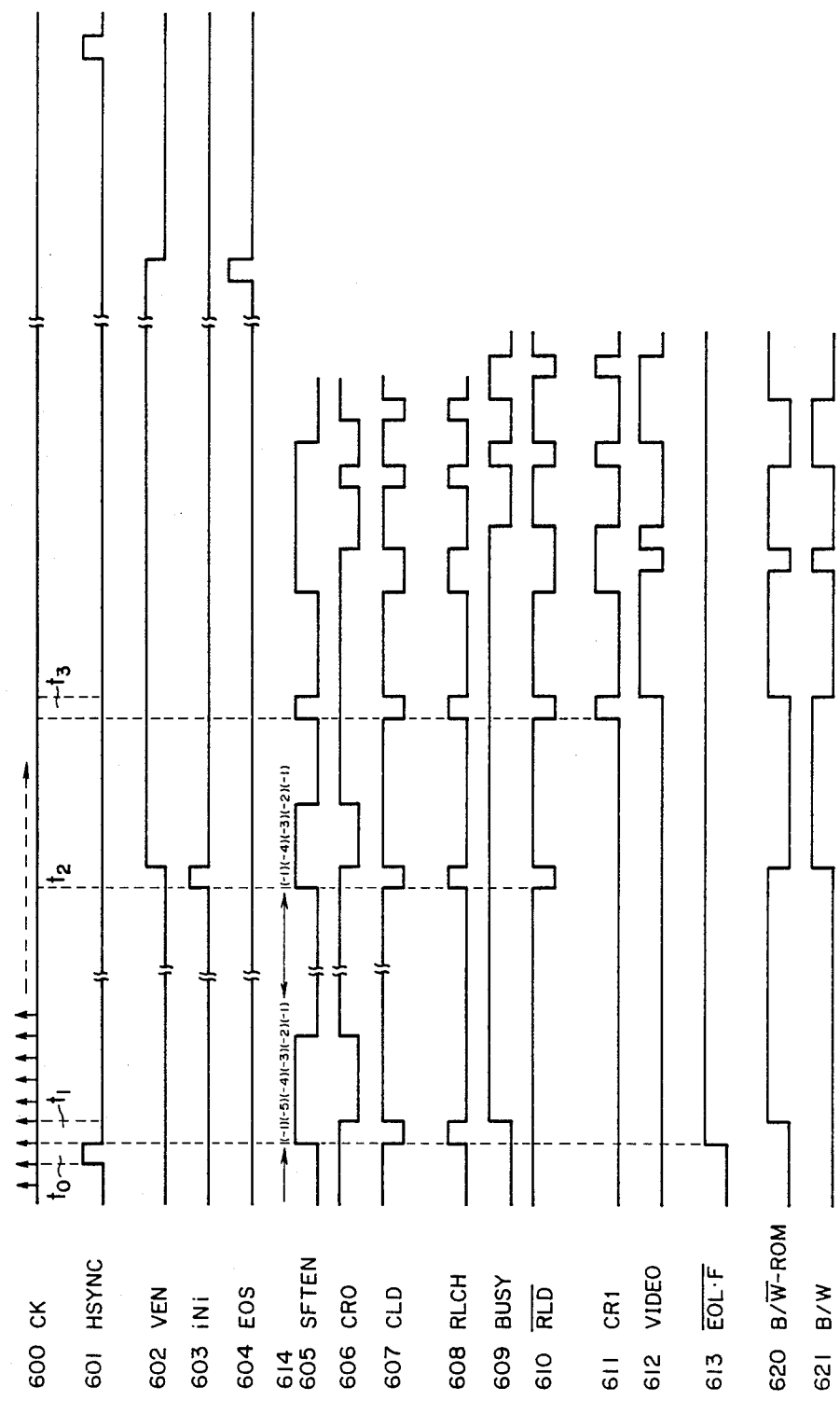
FIG. 6 is a timing chart showing the function of various parts of the circuit shown in FIG. 5.

FIG. 6 is a timing chart showing the function of principal parts of the circuit shown in FIG. 5. In FIG. 6, the aforementioned synchronization signal HSYNC 601 in the main scanning direction of the printer is generated for each scanning line, and the timing of said signal is taken as a reference to t0. A basic clock signal CK 600 has a frequency same as the image frequency. A section signal VEN 602 defines the effective image period within the main scanning line. Signal iNi 603 is a pulse which immediately precedes, by one clock or one bit, the section signal VEN, and EOS 604 is the final clock pulse of the section signal VEN.

In case of recording the image signals decoded from the MH codes by means of a laser beam printer as explained before, the horizontal synchronization signal HSYNC is generated by the beam detection signal indicating the arrival of the laser beam at a determined position in the raster scanning line, and the section signal VEN indicates a section of the photosensitive drum scanned by the laser beam for latent image formation.

As will be apparent from the foregoing, the time relationship of the signals 600–604 shown in FIG. 6 are generally to be fixed as constant values. In the present embodiment, the interval between the signal HSYNC 601 and the signal iNi 603 is fixed as 64 clocks. Also the duration of the signal VEN 602, indicating the number of pixels in a line, is defined as 4096 bits or pixels in the present embodiment.

At the time t0 in FIG. 6, the circuit shown in FIG. 5 is set to an initial state for each main scanning of the image output. More specifically, a leading image MH code in each line, which is a white MH code WB8 "10011" with a run length of eight, is in the "head positioning completed" state in the register 103, and the outputs C0–C12 (10011, 00010, 000 in this case) of said register 103 are supplied to the logic 104, ROM 105 etc.

In this state the content of the code length counter 107 is equal to $(-1)=(1111B)$, wherein $(-1)$ is defined to indicate the "head positioning completed" state. Flip-flops 510, 109 and 515 are in the reset state, while a flip-flop 509 is in the set state.

The set state (Q=1) of the flip-flop 509 indicates that the EOL code has been discharged from the register 103 after the detection of the EOL code. Also the set state (Q=1) of the flip-flop 510 indicates that a run length latch 513 is busy as will be explained later. The output signal Q of the flip-flop 515 constitutes the signal B/W-ROM, indicating the color of the MH code to be decoded as black in the level-1 state or as white in the level-0 state.

It is further assumed that the run length counter 108 is stopped and has a value zero. A signal SFTEN 605 on the control line enables, in the level-1 state, the register 103 to shift the MH codes. Also for the purpose of simplicity, it is assumed that the output signals Σ0–Σ2 and (C) of the accumulator 106 are all zero, indicating that 28 bits of the register 103 are all filled with effective MH codes, free from empty bits.

The foregoing is the state at the time t0. At a time t1, the signal HSYNC 601 shown in FIG. 6 is shifted to the low level to reset the flip-flop 509 shown in FIG. 5, and a signal EOLF 613 in FIG. 6 assumes the level-1 to shift the signal SFTEN 605 to the level-1 through an AND gate 508, thus enabling the counter 107 in FIG. 6 for counting operation. Simultaneously the address ports of the ROM 105 receive the outputs C0–C12 of the register 103, which are "10011XXXXXXXX" in the present example, and the code length outputs CL0–CL3 of the ROM 105 are supplied to the code length counter 107 through gates 503, 504. At the same time, because of the level-0 state of the signal CLD, the counter 107 assumes the load mode, whereby the values of said outputs CL0–CL3 are loaded into said counter 107. In the present example loaded is $(-5)$, which is a compliment to 2 of the code length (5) of the MH code WB8.

The outputs RL0–RL5 and M/T of the ROM 105 are supplied as input signals to the run length latch 513, which also receives the output Q of the flip-flop 515 as the signal B/W-ROM 620. In this state a signal RLCH 608 assumes a level-1 state to enable the latch 513, whereby the values D0–D7 are latched in the latch 513 in response to a clock at t1.

Simultaneously the flip-flop 510 is set and the flip-flop 515 is inverted at the time t1. The level-1 state of the busy signal 609 supplied as the output Q from the flip-flop 510 indicates that the latch 513 latches the effective run length. Also the level-1 state of the signal B/W-ROM 620 supplied as the output Q from the flip-flop 515 indicates that an MH code to be brought to the "head positioning completed" state in the register 103 has black color. On the other hand, the level-0 state of said B/W-ROM signal 620 indicates white color.

The signal SFTEN 605 is supplied through gates 505, 506 and given, as a signal SO, to the multiplexer 102 to cause one bit shift of the data in the register 103. In this manner the transfer of data of the MH code which has been in the head positioning completed state in the register 103 is completed, and the decoding of said MH code is terminated. Thus the bit shifting operation is effected under the control of the counter 107 enabled by the signal SFTEN 605, until a carry out signal CRO 606 is generated from said counter 107, whereby the decoded MH code is discharged from the register 103. In the present example, the one-bit shift in the register 103 is repeated until the value of the counter 107 changes from ($-5$) to ($-1$).

When the counter 107 reaches a value ($-1$), the decoded MH code (white MH code WB8 in the present example) is discharged and a succeeding code, which is a black MH code BB6 with a run length of six, reaches the "head positioning completed" state in the register 103, but the flip-flop 510 remain in the set state since the latch 513 still retains the run length of the preceding MH code WB8. Thus, when the signal CRO of the counter 107 assumes the level-1 state, the gate 511 releases a level-0 signal, whereby the signal SFTEN 605 is shifted to the level-0 state to stop the counter 107. Similarly the level-0 state of the SFTEN signal 605 shifts all the signals S0–S2 to zero, whereby the register 103 terminates the shifting operation to hold the data therein. Consequently the "head positioning completed" state of the code BB6 continues until a time t2.

At said time t2, the signal iNi 603 shifts the signal RLD 610 to zero, whereby the run length retained in the latch 513, which is a white run length of eight in the present example, is transferred to a counter 108 through a multiplexer 514. At the same time the flip-flop 510 is reset by the signal RLD 610, whereby the latch 513 is emptied and the busy state is cancelled. Thus a gate 511 releases a level-1 signal to shift the signal SFTEN 605 to the level-1 state as explained before, and the run length of MH code in the "head positioning completed" state in the register 103 is latched in the latch 513.

The MH codes are decoded in succession in this manner.

In response to the run length, which is $-5$ in this example, loaded in the counter 108 at the time t2, the counter 108 initiates the counting operation by the signal VEN 602 starting from a bit immediately following said time t2. Said counter 108 releases a signal CR1 611 when it reaches a value ($-1$) at a time t3 in the present example. Also the flip-flop 109 is set according to the color of the image designated by the B/W signal 621 from the latch 513. In this manner the first MH code has been converted into image signals, consisting of eight white bits in the present example.

After the rise of the VEN signal 602, the iNi signal 603 remains at the level-0 state until the arrival of a new HSYNC signal 601. Consequently, after the rise of the VEN signal 602, for example at a time t3, the flip-flop 510 is reset and released from the busy state by the SR1 signal 611, indicating the count-up state of the counter 108, instead of the iNi signal 603, whereby the entry of the run length obtained by decoding the succeeding MH code into the latch 513 is enabled.

In the foregoing explanation, it is assumed that the code length of the MH code is smaller than or equal to the run length, so that the MH codes can be decoded without interruption, by serially shifting the MH code, from the "head positioning completed state", with signals S0=1 and S1=S2=0 to the multiplexer 102 for discharging said MH code from the register 103. However, if the run length of the MH code is shorter than the code length, the run length counting of said MH code in the counter 108 will be completed during the code discharge from the counter 103. In order to avoid interruption in the image, it is necessary to transfer the next run length from the latch 513 to the counter 108 at this point. However the latch 513 has not received said run length from the ROM 105, since the succeeding MH code has not reached the "head positioning completed" state in the register 103.

In such case, therefore, the real-time image output is not possible and the image recording on the printer has to be interrupted. Such inconvenience occurs in case of decoding the aforementioned HSC codes, i.e. white MH codes with run lengths 1, 2 and 3, and a black MH code with run length 1.

For this reason, the MH code decoding logic 104 is used for these four HSC codes to operate the subsequent circuits as if serial shifting is made with the code length data CL0–CL3 from the ROM 105. More specifically, the logic 104 generates a load value ($-1$) from the HSC signal and load said value into the counter 107 through the gate 504. On the other hand, the outputs CL0–CL3 from the ROM 105 are inhibited by the HSC signal at a gate 503. Also the logic 104 releases output signals SF0–SF2 indicating a jump corresponding to the code length of the decoded MH code, thus controlling the multiplexer 102 through S0–S2. In this manner a shift of plural bits within a time of one bit is rendered possible. Stated differently, a code to be decoded next can reach the "head positioning completed" state in the register 103 within a time of one bit. The amount of said jump is also supplied to the accumulator 106 and is cumulatively added to the number of empty bits in the register 103.

The above-explained two shifting methods are used to repeat the "run length latch" and "run length counting" from the "head positioning completed" state, thus realizing the decoding operation without interruption in the image to be supplied to the printer. The EOL detecting circuit 112 releases a signal O-EOL upon detection of the EOL code in the outputs C0–C11 of the register 103. Upon detection of the EOL code indicating the end of a line by the EOL detecting circuit 112, said signal O-EOL is supplied through a timing circuit 523 to set the flip-flop 509 whereby the EOLF signal 613 is shifted to zero. Thus the SFTEN signal 605 is shifted to zero so that the register 103 is deactivated, whereby the MH code awaits the HSYNC signal in the "head positioning completed" state. In this manner the synchronization between the printer operation and the decoding operation is achieved in satisfactory manner.

The image reproduction is achieved by repeating the line scanning operation in the above-described manner.

Figure 7:
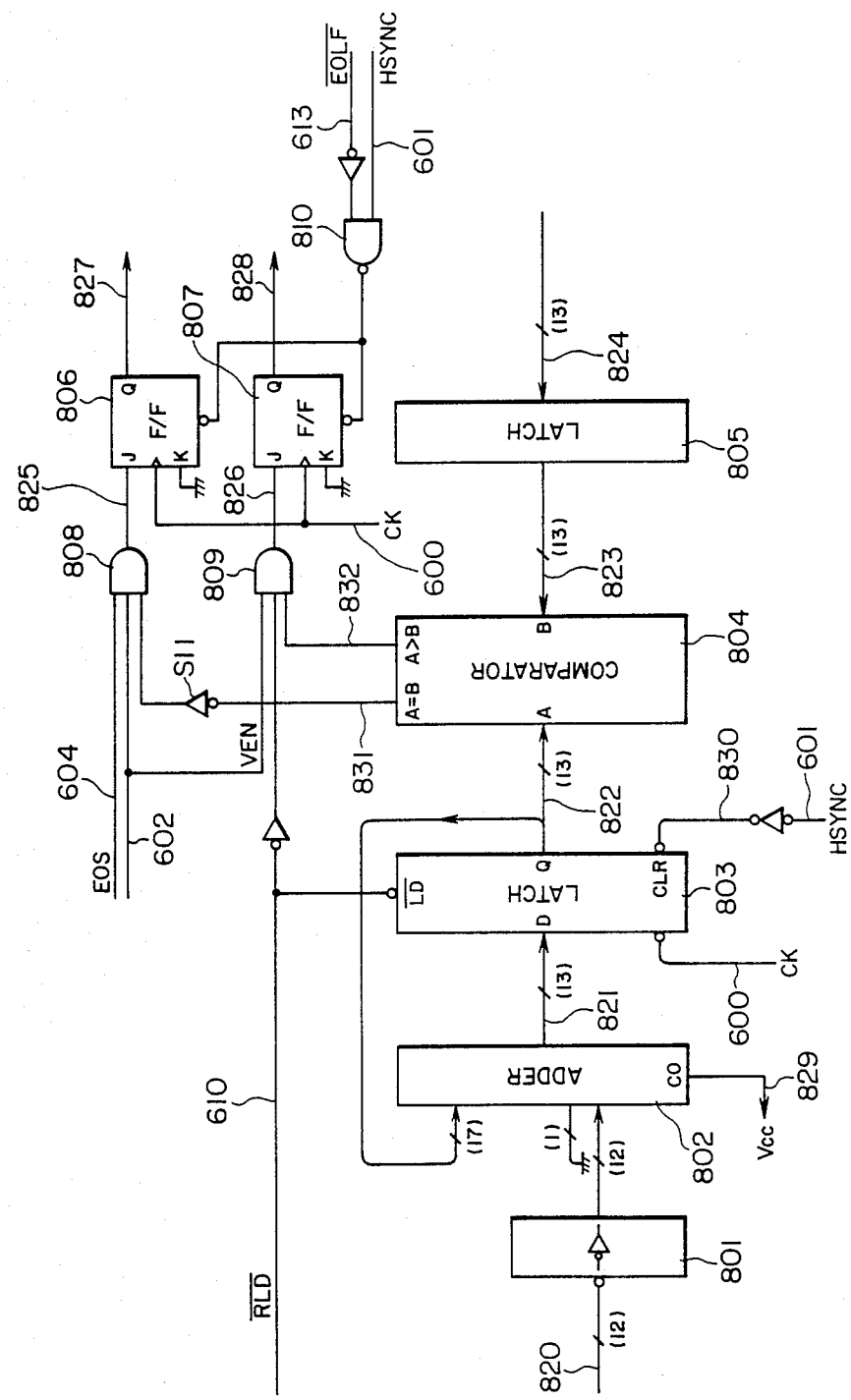
FIG. 7 is a block diagram showing a decode error detecting circuit.

Now reference is made to FIG. 7 for explaining the method of detecting an error in the decoding. The circuit shown in FIG. 7 is connected to a suitable position in the circuit shown in FIG. 5 or 7. In FIG. 7 there are shown an inverter 801, an adder 802, a latch 803, a comparator 804, a latch 805, and flip-flops 806, 807.

In FIG. 8, a signal 820 is same as the signal 820 released in FIG. 5 from the latch 513 through the multiplexer 514, and represents the run length obtained by decoding the MH code, as a compliment to 2.

The adder 802 and the latch 803 constitute an accumulator. The carry-over signal to the least significant bit of the adder 802 is set to "1" by a signal 829, whereby the output 821 of the adder 802 becomes equal to the complement to 2 of the run length 820. Consequently said output signal 821 is equal to a binary representation of the positive integer of said run length. The addition to the latch 803 is continued at the timing of the signal RLD 610, i.e. at the timing of loading the run length to be counted into the counter 108 shown in FIG. 5. A latch 803 is cleared by the HSYNC signal 601 released for each main scanning line. The output signal of the latch 803 represents the cumulative value of the run lengths in each line in binary number. On the other hand, the latch 805 retains the fixed run length of each line, which is 4096 in the present example corresponding to the number of pixels in a line and is received from a CPU by a signal 824. The comparator 804 compares the run length 822 "A" stored in the latch 803 with the correct value 823 "B" in the latch 805.

If a signal 831 indicating A=B is not released from the comparator 804 at the release of the EOS signal 604 shown in FIG. 6, i.e. at the end of each line, the flip-flop 806 is set by an output signal 825 from an AND gate 808. Stated differently, the set state of said flip-flop 806 indicates that the cumulative value A of the run lengths is not equal to the anticipated correct value B, which is 4096 in the present example, due to an error in the MH codes or decoding thereof.

If a state A>B occurs, the flip-flop 807 is immediately set, even in the course of accumulating the run lengths, by an output signal 826 of an AND gate 809 receiving an output signal 832 from the comparator 804. Thus the Q-output of the flip-flop 807 indicates that the cumulative value of the run lengths has exceeded the anticipated correct value, which is 4096 in the present example, already in the course of a line, due to a significant error in decoding operation of a line.

The flip-flops 806, 807 are reset by the level-0 state of the EOLF signal 613 shown in FIG. 6, i.e. in response to the detection of an EOL code by the EOL detecting circuit 112 and to the reception of the HSYNC signal 601. Consequently the separate EOL detecting circuit 112 is exclusively used for detecting the EOL code by inspecting the output signal 827 or 828 of the flip-flops 806, 807, thereby minimizing the error in synchronization resulting for example from an error in decoding.

In the present example the run lengths are cumulatively added in the accumulator, but it is also possible, for example, to subtract the run lengths in succession from a determined value, for example 4096, and to detect a borrowing state of the subtracting counter.

In response to the setting of the flip-flop 806 or 807 induced by an error in the decoding, a corresponding signal is transmitted to the buffer switch control circuit 303 in the printer shown in FIG. 9.

The buffer switch control circuit 303 selects the doubled line buffers of the printer for alternating the input and output thereof. In response to the set signal, or decoding error detection signal from the flip-flop 806 or 807, said circuit so selects the line buffer as to invalidate the image signals of a line containing said decoding error and to read the image signals of the preceding line again from the other line buffer to utilize said image signals again instead of the error-containing line. As an example, in case a decoding error appears in the course of storing the decoded image signals into the first line buffer 301, said image signals stored in said first line buffer 301 are invalidated and, after the completion of current signal readout from the second line buffer 302, same image signals are read again from said second line buffer 302.

In this manner the image signals of an error-containing line are excluded from the printing operation, in order to avoid undesirable effect on the reproduced image. The number of said line buffers in the printer may be in excess of two, and said error correcting line buffers may be provided in the decoding circuit.

As explained in the foregoing, the decoding of an image in the form of MH codes in the present embodiment is initiated by the detection of an EOL code preceding said MH codes, and is followed by decoding of the following codes constituting the first line of the image.

Though not illustrated, the MH encoded image is stored for example in an image memory present in front of the memory circuit 101 shown in FIG. 1 and is read and supplied to the decoding circuit through the memory circuit 101 by designating a readout start address in said image memory for example from a CPU.

In such case, the MH codes read from the image memory is not necessarily preceded by an EOL code, for example if the image readout is started from the middle of a page. In order to start correct decoding even in such case, the memory circuit 101 shown in FIG. 1 is cleared prior to the start of the decoding operation, then the MH codes are read from said memory until the memory circuit 101 becomes full as shown in FIG. 2, and the MH codes are then transferred to the decoding circuit. The decoding circuit only tries to detect an EOL code, disregarding other image codes until the detection of a first EOL code.

After the detection of the EOL code, the subsequent codes are handled as image information, and the decoding operation is effected by controlling the shift according to the code length. In this manner the detection of a first EOL code with the aforementioned EOL detecting circuit 112 allows to identify the partitions of the MH codes, thus enabling synchronized reproduction of the image.

In the above-mentioned operation of detecting the first EOL code, if all the bits in the register 103 are "0", said bits may be combined with an MH code or a part thereof transmitted from the memory circuit 101 and erroneously recognized as an EOL code "000000000001". In order to avoid such erroneous detection of the EOL code, all the bits C0-C27 of the register 103 are initialized to "1".

Figure 12:
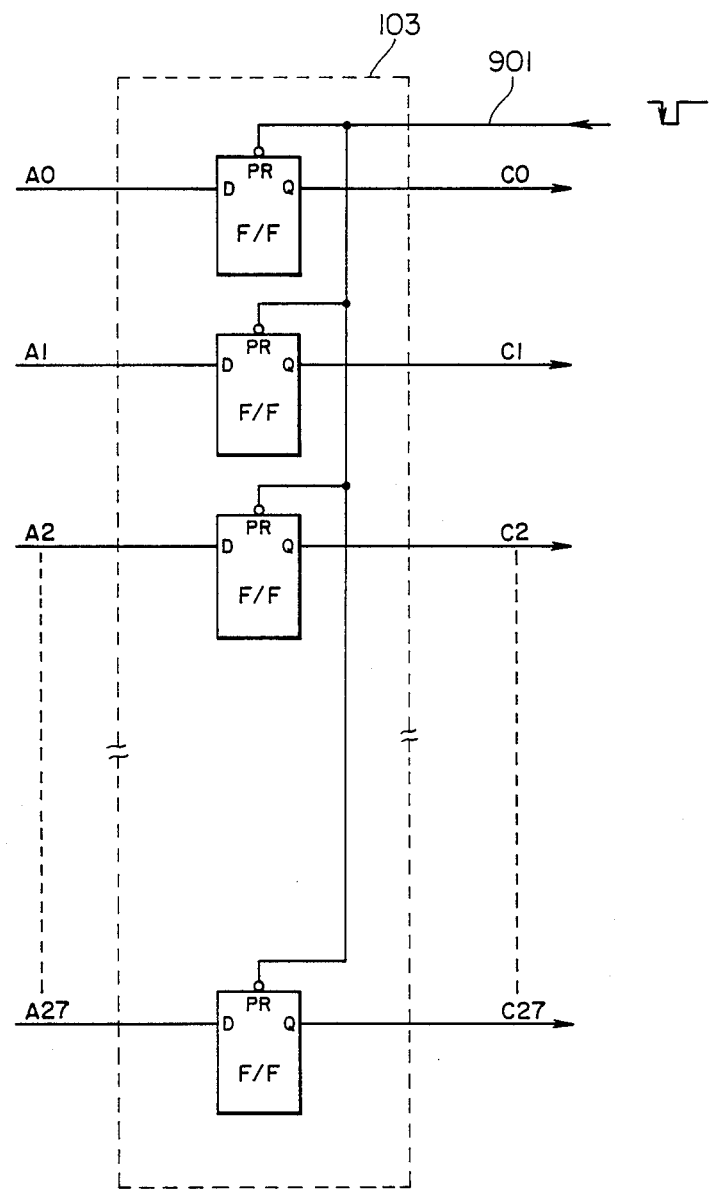
FIG. 12 is a circuit diagram showing an example of a register.

The method of such initialization will be explained in the following. FIG. 12 shows an example of the structure of the register 103, which in this case is composed of 28 flip-flops F/F. Thus a preset pulse 901 is supplied for example from a CPU to the preset terminals of all the flip-flops to shift the Q-output of all the flip-flops to "1". Said flip-flop may be composed for example of SN74S74N supplied by Texas Instruments, Inc.

Though the foregoing embodiment has been concentrated on the decoding of MH codes, it is also applicable to the decoding of codes compressed in other processes. Besides, in addition to the image recording on a printer such as laser beam printer, the image signals obtained by decoding are usable in various applications such as display for example on a cathode ray tube or filing as a bit image. Also it will be evident that the figures shown in the foregoing embodiment are not fixed but are subject to suitable selection according to the purpose of use or other circumstances.

As explained in detail in the foregoing, it is possible to securely decode the compressed codes and to achieve real-time decoding suitable even for high-speed image processing. It is therefore possible to supply an output unit such a high-speed printer for high-quality image recording, with decoded signals in effective manner.

Also a failure in the transmission or decoding of the compressed codes can be securely detected to minimize the effect resulting from such failure.

Also in the printing operation of the image signals obtained by decoding the compressed codes, a satisfactory synchronization is achieved between the printer and the signal processing unit.

Furthermore, the line synchronization code used as the reference in the decoding operation is securely detected, thus avoiding inconveniences such as error in synchronization in the decoding operation.

Furthermore, even when the compressed codes are supplied from the middle of a page or a line to the decoding circuit, it is possible to securely achieve the synchronization in the decoding operation, thus avoiding errors in the decoding.

What is claimed is:

1. A decoding apparatus for decoding image codes obtained by a compression process, comprising:
   means for storing image codes entered together with a particular code indicating the end of each line;
   means for decoding the image codes read out from said storing means;
   means for shifting the image codes in said storing means, in order to discharge the image code already decoded by said decoding means from said storing means; and
   plural detecting means respectively adapted to detect the presence of said particular code in said storing means, said plural detecting means being arranged so as to detect the presence of said particular code in different positions of said storing means each corresponding to the associated one of said plural detecting means.

2. A decoding apparatus according to claim 1, wherein said decoding means performs the decoding operation in response to a detection output signal of said detecting means.

3. A decoding apparatus according to claim 1, wherein said plural detecting means are adapted to output data indicating the stored position of said particular code in said storing means.

4. A decoding apparatus according to claim 1, wherein said shifting means performs a shifting operation in accordance with the image code decoded by said decoding means.

5. A decoding apparatus according to claim 1, further comprising means for recording an image based on image data from said decoding means.

6. A decoding apparatus according to claim 1, wherein the number of said plural detecting means corresponds to the maximum amount by which said shifting means is shiftable at a time.

7. A decoding apparatus according to claim 1, wherein each of the image codes is a variable length of code.

8. A decoding apparatus according to claim 1, wherein said decoding means outputs image data when addressed with the image code.

9. A decoding apparatus for decoding image codes obtained by a compression process, comprising:
   means for storing image codes entered together with a particular code indicating the end of each line;
   means for decoding image codes read out from said storing means;
   means for discharging the image code already decoded by said decoding means from said storing means; and
   means for detecting the presence of said particular code in said storing means;
   wherein, upon detecting the presence of said particular code by said detecting means and in response to termination of decoding of an image code just preceding to said particular code, said discharging means discharges said particular code, following said preceding decoded image code from said storing means.

10. A decoding apparatus according to claim 9, wherein said detecting means is operable also to detect a stored position of said particular code in said storing means, and the discharging means performs a discharging operation for said particular code according to thus detected stored position.

11. A decoding apparatus according to claim 9, wherein said decoding means performs a decoding operation according a detection output signal of said detecting means.

12. A decoding apparatus according to claim 9, wherein said discharging means performs a discharge operation in accordance with the image code decoded by said decoding means.

13. A decoding apparatus according to claim 9, wherein said detecting means comprises plural detecting units arranged so as to detect the presence of said particular code in different positions of said storing means each corresponding to the associated one of said plural detecting units.

14. A decoding apparatus according to claim 9, wherein said decoding means outputs image data when addressed with the image code.

15. A decoding apparatus according to claim 9, wherein each of the image codes is a variable length of code.

16. A decoding apparatus according to claim 9, further comprising means for recording an image based on the image data from said decoding means.

17. A decoding apparatus for decoding image codes obtained by a compression process, the image codes representing image data, comprising:
   memory means for continuously storing a plurality of image codes having variable lengths which are to be decoded;
   read means for reading out an image code to be decoded from said memory means;
   means for decoding the image code read out from said memory means; and
   discriminating means for producing a discrimination result as to whether the image code read out from said memory means is in a predetermined relationship with image data represented by said image code;
   wherein said read means is operable to read out the image code to be next decoded by said decoding means from said memory means, in different read out operations, in accordance with a discrimination result of said discriminating means.

18. A decoding apparatus according to claim 17, wherein said discriminating means discriminates whether or not the length of the image code is larger than the length of image data represented by said image code.

19. A decoding apparatus according to claim 17, further comprising means for recording an image based on the image data from said decoding means.

20. A decoding apparatus according to claim 17, wherein said decoding means is operable to perform a decoding operation in different manners in accordance with a relationship between the image code and the image data represented by said image code.

21. A decoding apparatus according to claim 18, wherein said decoding means outputs image data when addressed with the image code.

22. A decoding apparatus according to claim 18, further comprising means for discharging the image code already decoded by said decoding means from said memory means.

23. A decoding apparatus according to claim 18, further comprising means for detecting a particular code indicating the end of each line in said memory means.

24. A decoding apparatus for decoding image codes obtained by a compression process, comprising:
   means for entering image codes together with a particular code indicating an end of each line;
   means for decoding an image code entered by said entering means and generating image data; and
   means for recording an image line by line based on the image data generated from said decoding means, said recording means generating a synchronizing signal synchronized with an image recording operation on each line;
   wherein said decoding means initiates a decoding operation for image codes subsequent to the particular code, in response to the synchronizing signal generated from said recording means.

25. A decoding apparatus according to claim 24, further comprising means for storing the image codes entered by said entering means, wherein said decoding means is operable to decode the image codes read out from said storing means.

26. A decoding apparatus according to claim 25, further comprising means for discharging the image already decoded by said decoding means from said storing means.

27. A decoding apparatus according to claim 24, wherein each of the image code is a variable length of code.

28. A decoding apparatus according to claim 24, wherein said decoding means outputs image data when addressed with the image code.

29. A decoding apparatus according to claim 24, wherein said recording means is composed of a laser beam printer.

30. A decoding apparatus for decoding image codes obtained by a compression process, comprising:
   means for entering, in bit-serial manner, plural image codes consecutively;
   means for storing the image codes entered by said entering means;
   means for reading out the image code to be decoded from said storing means; and
   means for decoding image codes read from said storing means;
   wherein particular data, which are not to be decoded as the image code by said decoding means, are set in said storing means prior to the storage of the image codes therein.

31. A decoding apparatus according to claim 30, further comprising means for recording an image based on image data from said decoding means.

32. A decoding apparatus according to claim 30, wherein said storing means stores image codes entered in a bit-serial manner, and the stored image codes are read out from said storing means in a parallel manner by said reading out means.

33. A decoding apparatus according to claim 30, wherein said decoding means is addressed with an image code read out from said storing means, so as to output image data.

34. A decoding apparatus according to claim 30, wherein each of the image codes is a variable length of code.

35. A decoding apparatus according to claim 30, further comprising means for discharging the image code already decoded by said decoding means from said storing means.

36. A decoding apparatus according to claim 30, wherein said image codes include a particular code indicating the end of each line.

* * * * *

UNITED STATES PATENT AND TRADEMARK OFFICE
CERTIFICATE OF CORRECTION

PATENT NO. : 4,837,634
DATED : June 6, 1989
INVENTOR(S) : KATSUTOSHI HISADA

It is certified that error appears in the above-identified patent and that said Letters Patent is hereby corrected as shown below:

On the title page:

IN [73] ASSIGNEE

"Canon Kabushik Kaisha," should read --Canon Kabushiki Kaisha,--.

COLUMN 1

Lines 51-52, "in consecutively manner," should read --consecutively,--.

COLUMN 6

Line 41, "in" should read --in a--.

COLUMN 7

Line 31, "corresponding same" should read --corresponding to the same--.

COLUMN 9

Line 2, "circuits The" should read --circuits. The--.

COLUMN 11

Line 21, "explained" should read --explaining--.

COLUMN 18

Line 18, "according a" should read --according to a--.

UNITED STATES PATENT AND TRADEMARK OFFICE
CERTIFICATE OF CORRECTION

PATENT NO. : 4,837,634
DATED : June 6, 1989
INVENTOR(S) : KATSUTOSHI HISADA

It is certified that error appears in the above-identified patent and that said Letters Patent is hereby corrected as shown below:

COLUMN 19

Line 4, "claim 18," should read --claim 17,--.
Line 7, "claim 18," should read --claim 17,--.
Line 11, "claim 18," should read --claim 17,--.
Line 37, "image" should read --image code--.

Signed and Sealed this

Twenty-third Day of October, 1990

Attest:

HARRY F. MANBECK, JR.

Attesting Officer

Commissioner of Patents and Trademarks